United States Patent
El-Moznine et al.

(10) Patent No.: US 10,048,519 B1
(45) Date of Patent: Aug. 14, 2018

(54) MACH-ZEHNDER MODULATOR DRIVER

(71) Applicant: INPHI CORPORATION, Santa Clara, CA (US)

(72) Inventors: Abdellatif El-Moznine, Santa Clara, CA (US); Bruno Tourette, Santa Clara, CA (US); Hessam Mohajeri, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 15/909,672

(22) Filed: Mar. 1, 2018

Related U.S. Application Data

(62) Division of application No. 15/488,950, filed on Apr. 17, 2017, now Pat. No. 9,939,667.

(51) Int. Cl.
| | |
|---|---|
| *H03G 3/20* | (2006.01) |
| *G02F 1/025* | (2006.01) |
| *G02F 1/225* | (2006.01) |
| *G02F 1/01* | (2006.01) |
| *H04B 10/54* | (2013.01) |
| *G02F 1/21* | (2006.01) |

(52) U.S. Cl.
CPC ............ *G02F 1/025* (2013.01); *G02F 1/0121* (2013.01); *G02F 1/2255* (2013.01); *G02F 1/2257* (2013.01); *G02F 2001/212* (2013.01); *G02F 2201/12* (2013.01); *H03G 3/20* (2013.01); *H04B 10/54* (2013.01)

(58) Field of Classification Search
None
See application file for complete search history.

(56) References Cited

U.S. PATENT DOCUMENTS

| | | | | |
|---|---|---|---|---|
| 9,632,390 | B1 * | 4/2017 | Kato | G02F 1/2257 |
| 9,654,221 | B1 * | 5/2017 | Nagarajan | H04B 10/524 |
| 9,810,928 | B2 * | 11/2017 | Pobanz | G02F 1/0121 |
| 9,846,347 | B2 * | 12/2017 | Kato | G02F 1/2257 |
| 2009/0244685 | A1 * | 10/2009 | Hoshida | G02F 1/0123 359/279 |
| 2015/0212344 | A1 * | 7/2015 | Patel | G02B 6/132 385/2 |
| 2015/0293427 | A1 * | 10/2015 | Goi | G02F 1/025 385/3 |
| 2017/0134095 | A1 * | 5/2017 | Nagarajan | H04B 10/524 |
| 2017/0184941 | A1 * | 6/2017 | Kato | G02F 1/2257 |

* cited by examiner

*Primary Examiner* — Jerry Rahll
(74) *Attorney, Agent, or Firm* — Richard T. Ogawa; Ogawa P.C.

(57) ABSTRACT

A driver configuration for driving a Mach-Zehnder modulator (MZM) includes a first driver supplied by a first voltage and a second voltage and configured to provide a first two complimentary outputs respectively to a first N-electrode of a first branch of the MZM and a second N-electrode of a second branch of the MZM. Additionally, the driver configuration includes a second driver supplied by a third voltage and a fourth voltage and configured to provide a second two complimentary outputs respectively to a first P-electrode of the first branch and a second P-electrode of the second branch. The driver configuration sets a difference between the third voltage and the fourth voltage equal to a difference between the first voltage and the second voltage to provide a same peak-to-peak differential swing for modulating light wave through each transmission line and output a modulated light with twice of the peak-to-peak differential swing.

14 Claims, 6 Drawing Sheets

MACH-ZEHNDER MODULATOR DRIVER

CROSS-REFERENCE TO RELATED APPLICATIONS

This application is a divisional application of and claims priority to U.S. patent application Ser. No. 15/488,950, filed on Apr. 17, 2017, commonly assigned and hereby incorporated by references for all purposes.

BACKGROUND OF THE INVENTION

The present invention relates to telecommunication techniques. More particularly, the present invention provides an improved Mach-Zehnder Modulator driver for opto-electric communication system.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

40-Gbit/s and then 100-Gbit/s data rates over existing single-mode fiber is a target for the next generation of fiber-optic communication networks. The big hangup so far has been the fiber impairments like chromatic dispersion that are slowing the communication signal down. Everything is okay up to 10 Gbits/s plus a little, but beyond that, distortion and attenuation take their toll. Many approaches are proposed on modulation methods for transmitting two or more bits per symbol so that higher communication rates can be achieved. In recent years, considerable attention has been paid to silicon photonics technologies and the promise of more integration and lowering the cost of the optics. Mach-Zehnder modulators (MZM) can be used to handle higher data rates in next-generation silicon photonics based optical communication networks.

But many problems as roadblocks associated with the Silicon MZM drivers that need to swing higher voltage to reduce optical loss and to provide adequate electrical bandwidth yet still need to lower power consumption. Therefore, improved techniques and methods are desired.

BRIEF SUMMARY OF THE INVENTION

The present invention relates to telecommunication techniques. More specifically, various embodiments of the present invention provide an improved Mach-Zehnder Modulator (MZM) driver for light signal modulation for opto-telecommunication. In some embodiments, the driver is configured to drive all four electrodes of two branches of the MZM based on silicon photonics technology but can also be applied to drive MZM developed in other technologies.

In modern electrical interconnect systems, high-speed serial links have replaced parallel data buses, and serial link speed is rapidly increasing due to the evolution of CMOS technology. Internet bandwidth doubles almost every two years following Moore's Law. But Moore's Law is coming to an end in the next decade. Standard CMOS silicon transistors will stop scaling around 5 nm. And the internet bandwidth increasing due to process scaling will plateau. But Internet and mobile applications continuously demand a huge amount of bandwidth for transferring photo, video, music, and other multimedia files. This disclosure describes techniques and methods to improve the communication bandwidth beyond Moore's law.

In an embodiment, the present invention provides an apparatus for driving a Mach-Zehnder modulator (MZM). The apparatus includes a first driver supplied by a first voltage and a second voltage and configured to provide a first two complimentary outputs respectively to a first N-electrode of a first branch of the MZM and a second N-electrode of a second branch of the MZM thereby yielding a first peak-to-peak differential voltage. Additionally, the apparatus includes a second driver supplied by a third voltage and a fourth voltage and configured to provide a second two complimentary outputs respectively to a first P-electrode of the first branch and a second P-electrode of the second branch thereby yielding a second peak-to-peak differential voltage. A difference between the third voltage and the fourth voltage is equal to a difference between the first voltage and the second voltage. An offset is given to the third voltage relative to the first voltage. The first peak-to-peak differential voltage is configured to be equal to the second peak-to-peak differential voltage. Both the first N-electrode and the second N-electrode are terminated at the first voltage and both the first P-electrode and the second P-electrode are terminated at the third voltage.

In an alternative embodiment, the present invention provides an apparatus for driving a Mach-Zehnder modulator (MZM). The apparatus includes a first driver supplied by a first voltage and a second voltage and configured to provide a first pair of complimentary outputs respectively to drive a first N-electrode and a first P-electrode of a first branch of the MZM configured as a first plurality of lumped RC elements through a first optical transmission line respectively coupled to the first N-electrode via a first plurality of first coupling capacitors and to the first P-electrode via a first plurality of second coupling capacitors. The first transmission line is configured to pass a first light wave split from a continuous-wave laser input. The apparatus additionally includes a second driver supplied by the first voltage and the second voltage and configured to provide a second pair of complimentary outputs respectively to drive a second N-electrode and a second P-electrode of a second branch of the MZM configured as a second plurality of lumped RC elements through a second optical transmission line respectively coupled to the second N-electrode via a second plurality of first coupling capacitors and to the second P-electrode via a second plurality of second coupling capacitors. The second transmission line is configured to pass a second light wave split from the same continuous-wave light input. The first pair of complimentary outputs and the second pair of complimentary outputs are configured to be out of phase to each other and have a same peak-to-peak differential swing for respectively modulating the first light wave through the first transmission line and the second light wave through the second transmission line and to produce a modulated light based on twice of the peak-to-peak differential swing across the MZM.

In another alternative embodiment, the present invention provides a driver structure for driving a Mach-Zehnder modulator (MZM), the driver structure includes a driver supplied by a first voltage and a second voltage and configured to provide a first output and a second output complimentary to the first output. The first output is split evenly to respectively drive a first N-electrode of a first branch of the MZM and a second P-electrode of a second branch of the MZM. The second output is split evenly to respectively drive a first P-electrode of the first branch of the MZM and a second N-electrode of the second branch of the MZM. The first branch is configured as a first plurality of lumped RC elements laid in parallel through a first optical transmission line respectively coupled to the first N-electrode via a first plurality of first coupling capacitors and to the first P-electrode via a first plurality of second coupling capacitors. The first transmission line is configured to pass a first light wave being one-half split from a continuous-wave laser input. The second branch is configured as a second plurality of lumped RC elements laid in parallel through a second optical transmission line respectively coupled to the second N-electrode via a second plurality of first coupling capacitors and to the second P-electrode via a second plurality of second coupling capacitors. The second transmission line is configured to pass a second light wave being remaining one-half split from the same continuous-wave light input. The first output and the complimentary second output are configured to have a same peak-to-peak differential swing for respectively modulating the first light wave through the first transmission line and the second light wave through the second transmission line and to produce a modulated light based on twice of the peak-to-peak differential swing across the MZM.

The present invention achieves these benefits and others in the context of known waveguide laser modulation technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention relates to telecommunication techniques. More specifically, various embodiments of the present invention provide an improved Mach-Zehnder Modulator (MZM) driver for light signal modulation for optotelecommunication. In some embodiments, the driver is configured to drive all four electrodes of two branches of the MZM based on silicon photonics technology but can also be applied to drive MZM developed in other technologies.

In the last decades, with advent of cloud computing and data center, the needs for network servers have evolved. For example, the three-level configuration that have been used for a long time is no longer adequate or suitable, as distributed applications require flatter network architectures, where server virtualization that allows servers to operate in parallel. For example, multiple servers can be used together to perform a requested task. For multiple servers to work in parallel, it is often imperative for them to be share large amount of information among themselves quickly, as opposed to having data going back forth through multiple layers of network architecture (e.g., network switches, etc.).

Leaf-spine type of network architecture is provided to better allow servers to work in parallel and move data quickly among servers, offering high bandwidth and low latencies. Typically, a leaf-spine network architecture uses a top-of-rack switch that can directly access into server nodes and links back to a set of non-blocking spine switches that have enough bandwidth to allow for clusters of servers to be linked to one another and share large amount of data.

In a typical leaf-spine network today, gigabits of data are shared among servers. In certain network architectures, network servers on the same level have certain peer links for data sharing. Unfortunately, the bandwidth for this type of set up is often inadequate. It is to be appreciated that embodiments of the present invention utilizes PAM (e.g., PAM4, PAM8, PAM12, PAM16, etc.) in leaf-spine architecture that allows large amount (up terabytes of data at the spine level) of data to be transferred via optical network.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded with the widest scope consistent with the principles and novel features disclosed herein.

Figure 1:
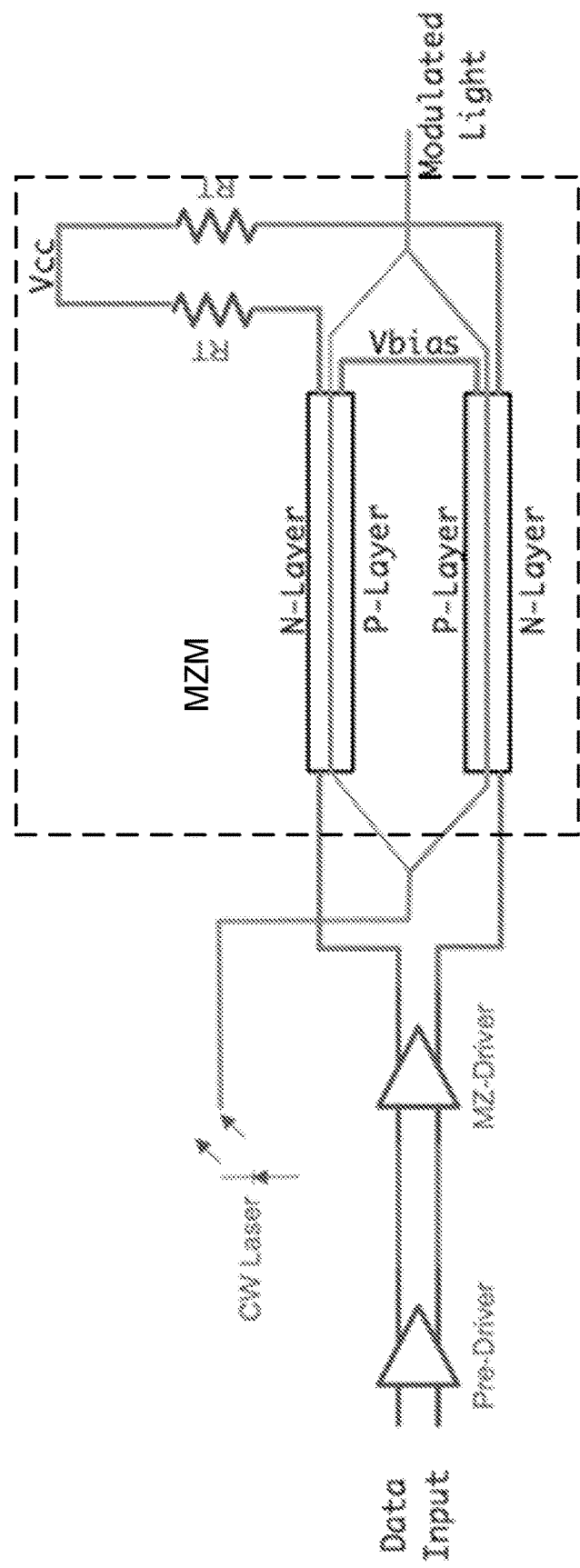
FIG. 1 is a simplified diagram of a conventional driver configuration for driving a Mach-Zehnder Modulator (MZM).

FIG. 1 is a simplified diagram of a conventional driver configuration for driving a Mach-Zehnder Modulator (MZM). As shown, an MZM includes two branches, each usually being in a linear shape formed with respect N-type and P-type materials configured in a lengthwise direction as a PN-junction. The two branches are associated with two optical transmission lines through which two traveling light waves originated from a continuous-wave laser input are respectively modulated based on an AC voltage signal applied between a P-electrode and an N-electrode of the corresponding branch. The AC voltage signal is typically a differential drive voltage provided by a differential driver, MZ-driver, based on a differential data input. Two outputs of the MZ-driver are only fed to two N-electrodes of the two branches while the two P-electrodes of the two branches are commonly biased. Each branch drive circuit is looped by commonly terminating at a supplied RF voltage Vcc respectively via a termination resistor RT. At no time the PN-junction is forward biased so that the N-electrode voltage is always higher than the bias at the P-electrode. The N-type material and P-type material in the PN-junction create a depletion region in which the light shifts the phase based on the drive voltage applied to the N-electrode. At the end of the MZM the light waves from the two branches are combined in constructive or destructive manner based on the applied drive voltage. Optionally, a pre-driver is included and disposed in front of the MZ-driver for either stabilizing or amplifying the input signal.

Figure 2:
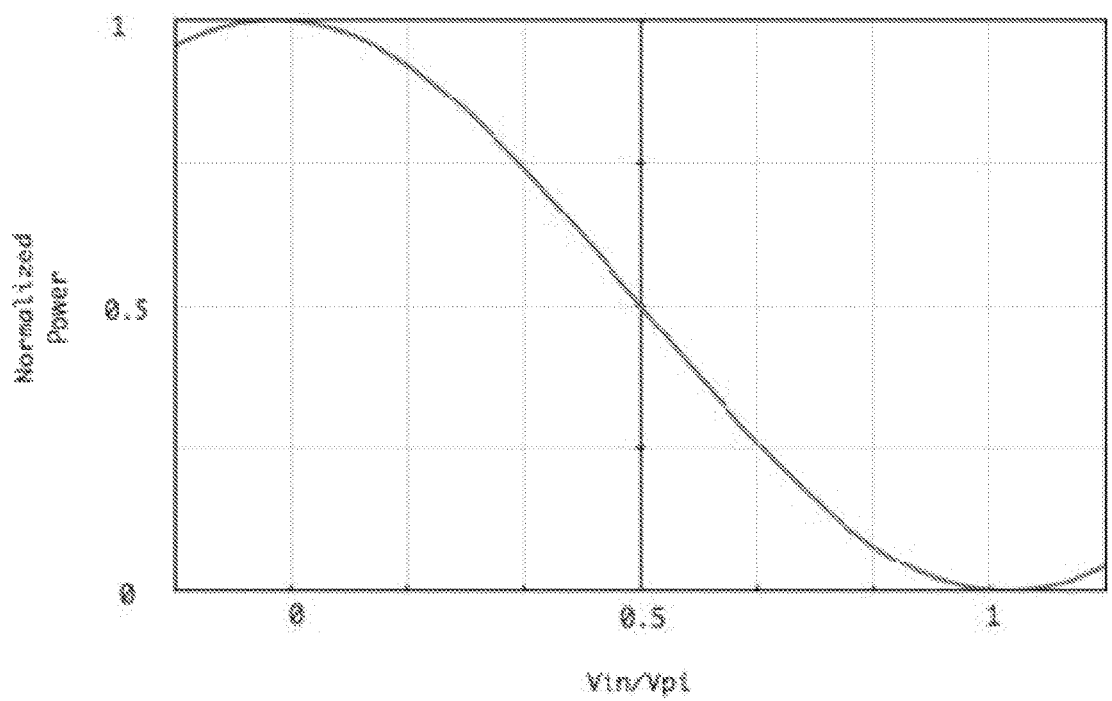
FIG. 2 is a schematic diagram of a MZM optical power transfer function.

FIG. 2 is a schematic diagram of a MZM power transfer function, which shows that intensity of the traveling light wave goes through a complete cycle based on the drive voltage applied on the N-electrode of each branch of the MZM. As shown, one important parameter of the MZM is Vpi, which is a swing required per unit length of the branch to go from full light power to zero power. This value indicates how much the driver needs to swing for a certain application. Theoretically one can increase the length of the modulator to reduce the swing requirements from the driver but due to losses this is not practical. Usually the Vpi value is larger for the MZM formed under silicon photonics technologies than those under other processes, making it rather challenging to increase Silicon Photonics driver power.

Another parameter is the bandwidth of the MZM. Due to losses in the modulator, as the speed increases the signal attenuates along the MZM electrodes. For this reason, a MZM electrode or namely the MZM branch cannot be made arbitrarily long.

Another parameter is the optical loss along the MZM branches. As the length of the electrodes increase the light attenuates along the channel of the PN-junction. A long MZM branch will not allow enough light to reach the output of the MZM and deteriorates the transmitter optical signal-to-noise ratio and ultimately the reach of the optical signal in the next work.

For the above reasons a MZM branch cannot be arbitrarily long to accommodate power consumption and the driver constraints. It is required to have a shorter MZM length to provide the required bandwidth and lower optical loss. However, shorter MZM length will require a driver with higher drive voltage swing due to shorter MZM electrodes. The higher swing on the driver then increases the power consumption of the system. Also, the high-speed drivers need to use fast process technologies which usually have much lower voltage breakdown.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

It is an object of the present invention to provide a driver structure or configuration for driving a MZM, particularly a Silicon Photonics MZM that needs to swing high voltages to reduce the optical loss and to provide adequate electrical bandwidth, while still keeping low in power consumption and manufacture cost. Other than choosing the drivers based on expensive GaAs or InPh under exotic processes which can achieve high drive voltage swing at an expense of increasing the power consumption quadratically, the present disclosure provides a driver structure based on bulk silicon to be compatible with silicon photonics platform with much reduced power consumption and lower cost.

Figure 3:
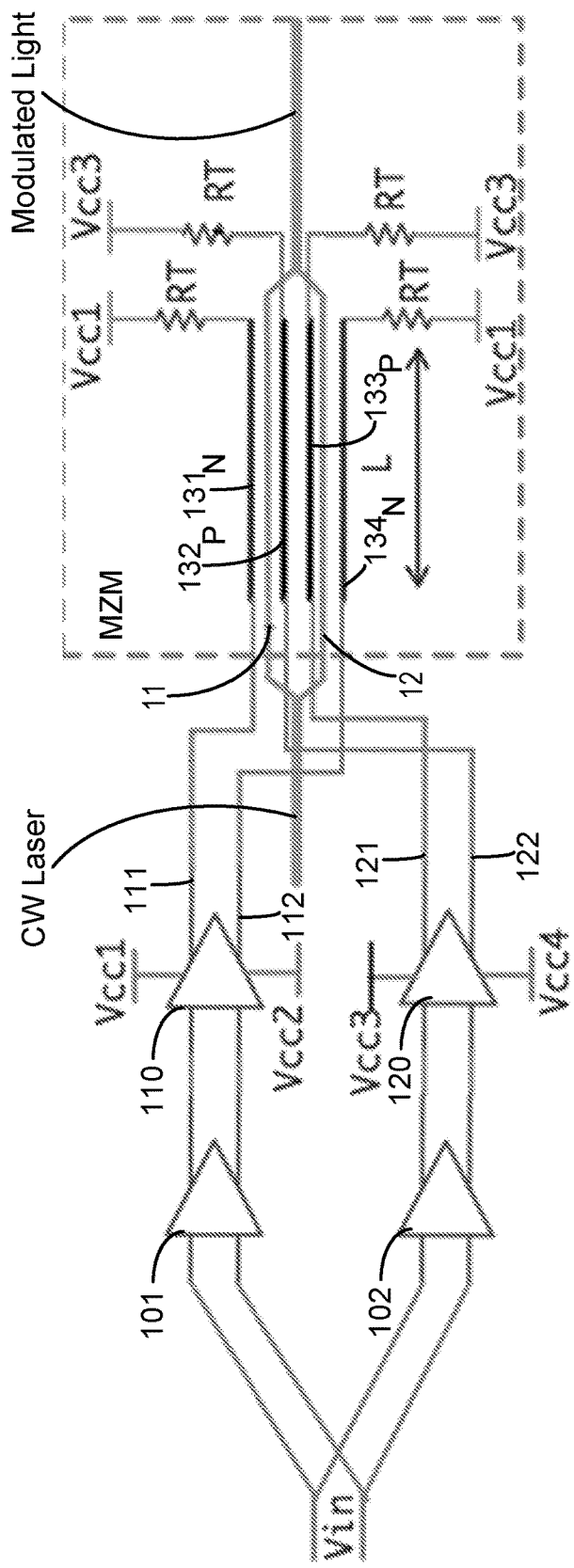
FIG. 3 is simplified diagram of a driver configuration including two drivers for driving all electrodes of a MZM according to an embodiment of the present invention.

FIG. 3 is simplified diagram of a driver configuration including two drivers for driving all electrodes of a MZM according to an embodiment of the present invention. This diagram is merely an example, which should not unduly limit the scope of the claims. One of ordinary skill in the art would recognize many variations, alternatives, and modifications. As shown, two drivers are disposed to respectively receive two differential data inputs that are split from one original data input Vin with equal power. A first driver 110 is operated under two supplied voltages, a first voltage Vcc1 and a second voltage Vcc2, to generate two complimentary drive voltage outputs 111 and 112, yielding a first differential drive voltage. A second driver 120 is operated under two supplied voltages, a third voltage Vcc3 and a fourth voltage Vcc4, to generate two complimentary drive voltage outputs 121 and 122, yielding a second differential drive voltage. Then, these drive voltage outputs are crossly fed to all four electrodes of the MZM with two branches. In particular, the MZM includes a first branch (top) associated with a first optical transmission line 11 and a second branch (bottom) associated with a second optical transmission line 12. The first branch is simplified as a single-segment PN-junction having a first N-electrode 131 and a first P-electrode 132. The second branch is similarly simplified as a single-segment PN-junction having a second N-electrode 134 and a second P-electrode 133.

In an embodiment, as shown in FIG. 3, the first driver 110 is configured to feed the drive voltage output 111 to the first N-electrode 131 and the complimentary drive voltage output 112 to the first N-electrode 134. At the same time, the second driver 120 is configured to feed the drive voltage output 121 to the second P-electrode 133 and the complimentary drive voltage output 122 to the first P-electrode 132. Thus, each of all four electrodes of the MZM is driven by a drive voltage. Both N-electrodes 131 and 134 are terminated at the first supplied voltage Vcc1 through a termination resistor RT and both P-electrodes 132 and 133 are terminated at the third supplied voltage Vcc3 through a termination resistor RT with same resistance. For example, the termination resistor RT can be 50 ohms or 32 ohms or other values.

In an embodiment, the two drivers are offset by using their supply voltages since the PN-junction on the MZM must not be forward biased. Therefore, for the first driver operated under Vcc1 and Vcc2, Vcc1 must be greater than Vcc2 and for the second driver operated under Vcc3 and Vcc4, Vcc3 is greater than Vcc4. In the current embodiment, the two drivers are configured to be operated with a same difference between two supplied voltages, e.g., Vcc1−Vcc2=Vcc3−Vcc4.

In still the embodiment, the first driver 110 is a differential driver configured with a first gain value to generate the first differential drive voltage based on a differential data input and the second driver 120 is also a differential driver configured with a second gain value to generate the second differential drive voltage based on the same differential data input. Each differential drive voltage from each driver has two complimentary outputs. Each output has a Vppd/2 swing, where the Vppd is a peak-to-peak differential voltage of each driver. Vppd is determined by a gain value associated with a design of each driver. In the embodiment, the first gain value designed for the first driver 110 is set to be equal to the second gain value designed for the second driver 120 so that they have a same peak-to-peak differential voltage Vppd1=Vppd2=Vppd. For the driver configuration with two drivers disclosed in FIG. 3 for respectively driving two branches of the MZM, each branch of the MZM is subjected to an output peak-to-peak differential swing Vppd and the two branches of the MZM then are subjected to at least twice of the peak-to-peak differential swing, i.e., 2×Vppd without need of changing the length of the MZM branches. More details about the two drivers respectively producing two differential drive voltages are described below.

Figure 4:
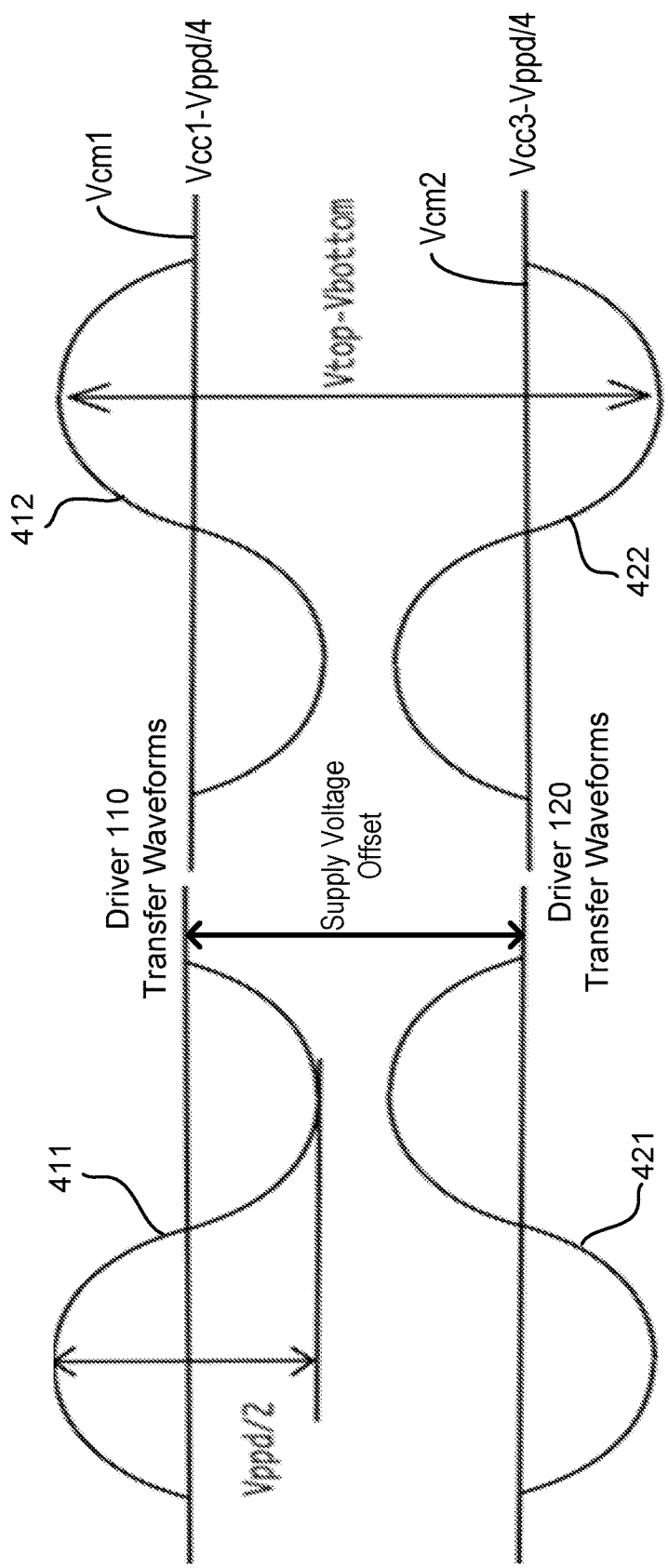
FIG. 4 shows transfer waveforms of the two drivers of FIG. 3 according to an embodiment of the present invention.

FIG. 4 shows transfer waveforms of the two drivers of FIG. 3 according to an embodiment of the present invention. As shown, the top waveforms show a first output 411 and a first complimentary output 412 of the first differential drive voltage generated by the first driver 110. Each of them is swung with the first peak-to-peak differential voltage of Vppd/2 around a first common mode voltage Vcm1 which is a DC base voltage set between the two supplied voltages, first voltage Vcc1 and second voltage Vcc2, for the first driver 110. By setting, Vcm1=Vcc1−Vppd/4. The bottom waveforms show the second output 421 and a second complimentary output 422 of the second differential drive voltage generated by the second driver 120. Each of them is swung with the second peak-to-peak differential voltage of Vppd/2 around a second common mode voltage Vcm2 which is a DC base voltage set between the two supplied voltages, third voltage Vcc3 and fourth voltage Vcc4, for the second driver 120. By setting, Vcm2=Vcc3−Vppd/4. As the two drivers are offset from each other using the supplied voltages, the first common mode voltage Vcm1 is also offset from the second common mode voltage Vcm2 by the supply voltage offset, i.e., Vcm1−Vcm2=Vcc1−Vcc3.

Also noted in FIG. 4, in a specific example, Vcm1−Vppd/4>Vcm2+Vppd/4. The supplied voltages are chosen for the two drivers 110 and 120 of FIG. 3 to give the best performance for the MZM on the condition that Vcc1−Vcc4 is always restricted below a process breakdown voltage of the PN-junctions of the MZM. In an example, Vcc1 is a standard power supply voltage of 3.3V and Vcc2 is grounded to 0V. In this case, Vcc3 can be offset from the Vcc1 as a positive voltage at +1.5V, and Vcc4 is supplied as a negative voltage at −1.8V, making Vcc1−Vcc2=Vcc3−Vcc4.

In some embodiments, each branch of the MZM is a silicon-based linear waveguide formed on a SOI substrate. By itself, the first branch is also the first optical transmission line 11 configured to pass a first light wave and the second branch is also the second optical transmission line 12 configured to pass a second light wave. The first light wave and the second light wave are split from a single laser input from a continuous-wave laser source which is subjected to be modulated based on electrical data input when they are transferred through the MZM. For the driver configuration of FIG. 3 under the conditions defined above, the linear waveguide can be configured as a single segment PN-junction formed with a P-type region in parallel sided with an N-type region along the lengthwise direction. Both the P-type region and the N-type region are made of silicon material by doping corresponding P-type or N-type impurities therein. Optionally, an insulation layer can be inserted between the P-type region and the N-type region. The P-type region is directly coupled to or simply serves as the P-electrode of the branch and the N-type region is directly coupled to or simply serves as the N-electrode of the same branch of the MZM.

In a specific embodiment, the MZM is implemented for communication with a standard non-return-to-zero (NRZ) line code, a binary code, in which "1"s are represented by one significant condition (usually a positive voltage) and "0"s are represented by some other significant condition (usually a negative voltage), with no other neutral or rest condition.

In another specific embodiment, the MZM modulation can be implemented as pulse-amplitude modulation (PAM) as an alternative scheme compared to NRZ scheme. Using the PAM scheme, the message information is encoded in the amplitude of a series of signal pulses.

Figure 5:
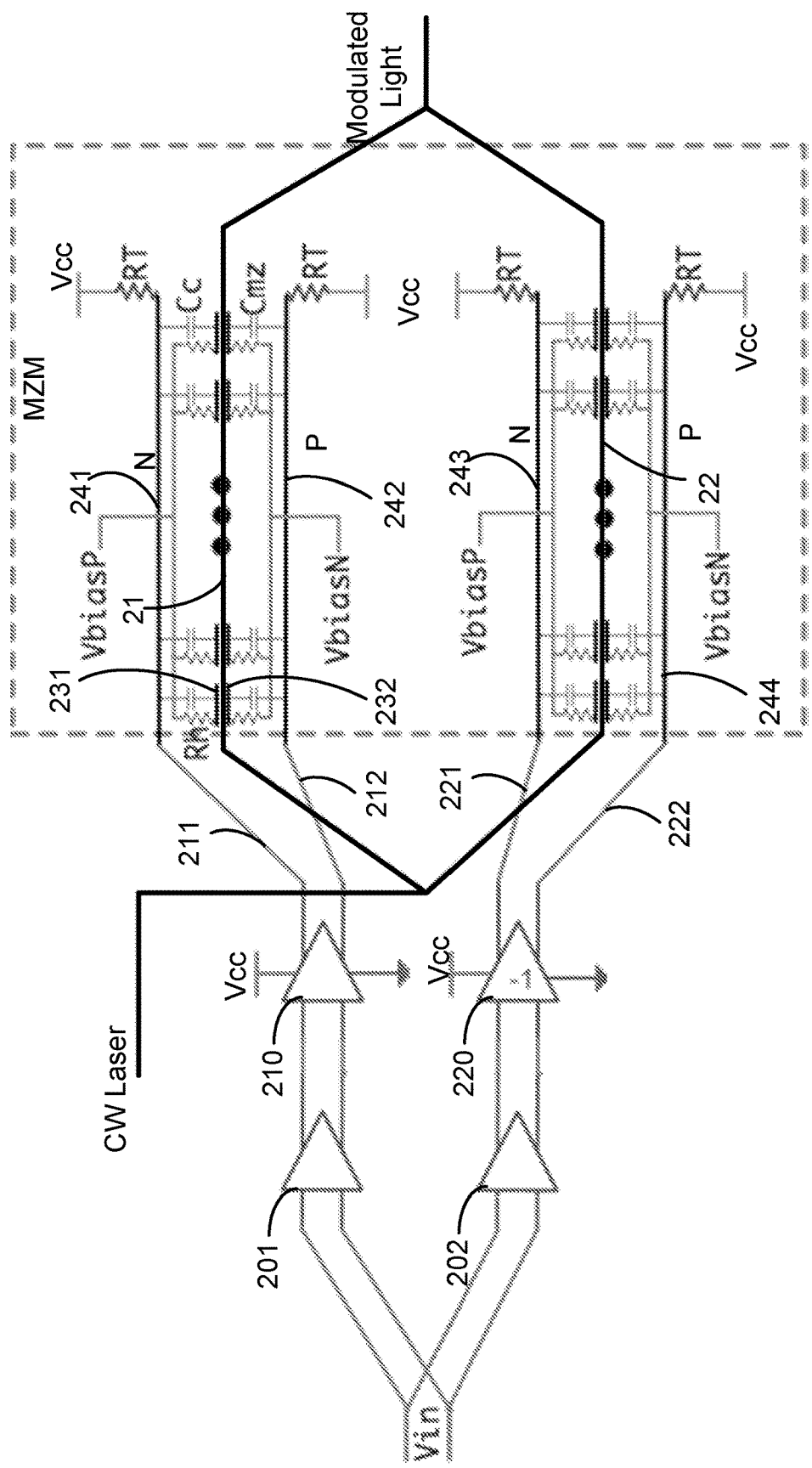
FIG. 5 is a simplified diagram of a driver configuration including two drivers for driving all electrodes of a MZM according to an alternative embodiment of the present invention.

FIG. 5 is a simplified diagram of a driver configuration including two drivers for driving all electrodes of a MZM according to an alternative embodiment of the present invention. This diagram is merely an example, which should not unduly limit the scope of the claims. One of ordinary skill in the art would recognize many variations, alternatives, and modifications. Referring to FIG. 5, an alternative two-driver configuration for driving all electrodes of a MZM which is configured to have coupling capacitors to couple with the optical transmission lines 21 and 22 respectively associated with two branches of the MZM. Each of the two drivers 210 and 220 is operated under same supply voltages, one provided with Vcc and another one grounded. In this case, the optical transmission line 21 (or 22) effectively is configured as a multi-segment waveguide instead of the single segment waveguide applied in FIG. 3. Using the first branch (top one in FIG. 5) of the MZM as an example, it is effectively configured as a plurality of lumped RC elements through entire length of the optical transmission line 21. Each lumped RC element is a reflection cancellation subcircuit including a pair of leakage resistors $R_h$ and a MZ-capacitor Cmz. The MZ-capacitor Cmz has a first terminal 231 coupled to an N-electrode 241 common for all lumped RC elements via a first coupling capacitor Cc and has a second terminal 232 coupled to a P-electrode 242 common for all lumped RC elements via a second coupling capacitor Cc. One of the pair of leakage resistors $R_h$ is coupled between the first terminal 231 of Cmz and a first bias node applied with VbiasP and another one of the pair of leakage resistor $R_h$ is coupled between the second terminal 232 of Cmz and a second bias node applied with VbiasN. The first coupling capacitor Cc and the second coupling capacitor Cc have substantially the same capacitance. The MZ-capacitor Cmz is just dielectric parasitic capacitor associated with each segment of multiple segmented waveguide which are broken from a total length of a linear waveguide through the first optical transmission line 21. Effectively, the MZM needs to have its total length broken into segments small enough to approximate the lump element at the frequency of interest. The leakage resistor $R_h$ is a high value resistor forming a leakage path to the corresponding bias voltages respectively applied through the two bias nodes.

Referring back to FIG. 5, in the embodiment, the driver configuration includes a first driver 210 and a second driver 220 disposed in parallel to receive a same differential data input Vin while the second driver 220 is configured to be 180 degree out of phase relative to the first driver 210. The first driver 210 is operated under two supplied voltages, a first voltage Vcc and a second voltage being typically grounded to 0V, to provide a first differential drive voltage including a first output 211 and a second output 212. The second output is complimentary to the first output 211. The two complimentary outputs 211 and 212 are applied as a first differential drive voltage to drive two electrodes of the first branch of the MZM. The first output 211 is fed to the first N-electrode 241 which is terminated with the first voltage Vcc and the second output 212 is fed to the first P-electrode 242 which is also terminated with the first voltage Vcc. For the first branch of the MZM as configured in FIG. 5 is to use coupling capacitors to couple the respective MZ capacitors and alternate bias voltages are applied to two bias nodes, one with VbiasP and another with VbiasN, no different termination voltage is necessary. The two complimentary outputs of the first driver 210 can be illustrated by two waveforms substantially similar to those for the first driver 110 shown in FIG. 4, each with a Vppd/2 swing around a same DC level of Vcc−Vppd/4. In an example, given the two supply voltages as 3.3V and 0V, VbiasP is set to 1.0V, and VbiasN is set to 2.4V to ensure non-forward bias condition for the PN-junctions associated with the plurality of lumped RC elements in the first branch of the MZM. The first branch of the MZM then is subjected to a drive voltage with peak-to-peak swing of Vppd for modulating the light wave pass through the first optical transmission line 21.

Referring to FIG. 5 again, in the embodiment, the second driver 220 is configured with a same gain value to output a pair of complimentary outputs 221 and 222 as a second differential drive voltage substantially 180 degrees out of phase relative to the first differential drive voltage provided by the first driver 210. The outputs 221 and 222 are respectively fed to a second N-electrode 243 and a second P-electrode 244 of a second branch of the MZM. In this embodiment, the second branch (bottom one in FIG. 5) of the MZM is configured substantially in a same way as the first branch (top one in FIG. 5) with a plurality of the lumped RC elements through its entire length of the segmented linear waveguide through the second transmission line 22. It is also subjected to a bias setting involved with two bias nodes respectively applied with the VbiasP and the VbiasN, the same as those in the first branch. Thus, the two complimentary outputs 221 and 222 of the second driver 220 can be illustrated by two waveforms substantially similar to those for the second driver 120 shown in FIG. 4, each with a peak-to-peak swing Vppd/2 around a same DC level of Vcc−Vppd/4. Note, the two waveforms have the same DC level voltage as the MZM configuration with coupling capacitors being used to couple with the transmission lines and bias setting involved with two bias nodes respectively applied with the VbiasP and the VbiasN being implemented. The second branch, then, is also subjected to a drive voltage with the peak-to-peak swing of Vppd but with 180 degrees out of phase relative to the first branch. Overall, the light waves that pass through two transmission lines 21 and 22 respectively associated with the first and second branch can be recombined and outputted as a modulated light driven by a peak-to-peak differential swing of 2×Vppd. Therefore, the driver configuration disclosed in FIG. 5 doubles the swing on modulating light signal through the MZM with a same length. For a given designed swing, each driver can be designed with a high value of that swing so that and the power consumption only increase linearly.

Optionally, referring to FIG. 5, two pre-drivers 201 and 202 are disposed respectively in front of the first driver 210 and the second driver 220. The different data input Vin can be processed to provide more stable data input with desired format of either NRZ or PAM for modulating a continuous-wave laser input received by the MZM to obtain a modulated output light.

Figure 6:
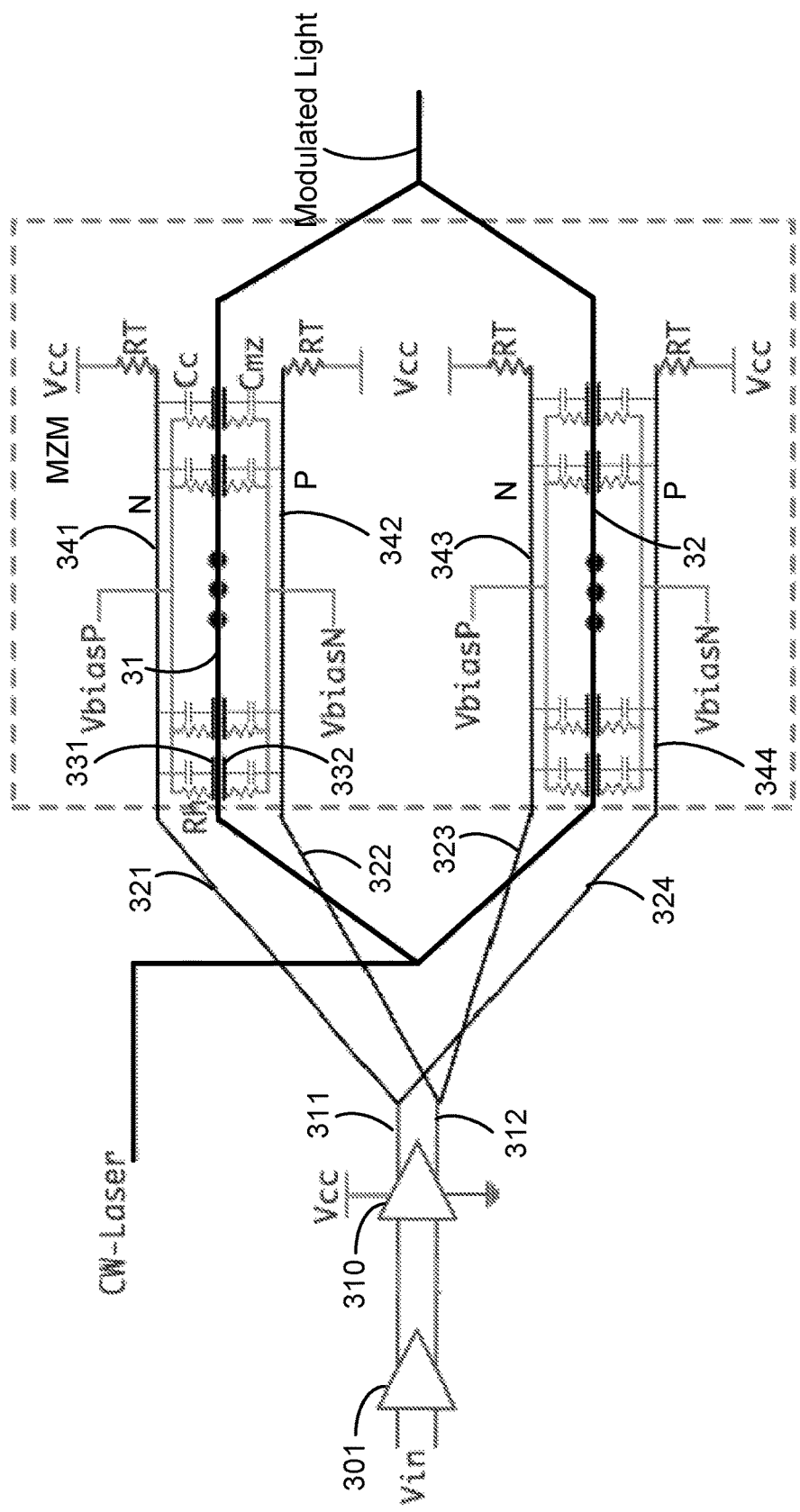
FIG. 6 is a simplified diagram of a driver configuration including one driver for driving all electrodes of a MZM according to another alternative embodiment of the present invention.

FIG. 6 is a simplified diagram of a driver configuration including one driver for driving all electrodes of a MZM according to another alternative embodiment of the present invention. This diagram is merely an example, which should not unduly limit the scope of the claims. One of ordinary skill in the art would recognize many variations, alternatives, and modifications. As shown, the driver configuration includes one driver 310 operated under a supply voltage Vcc and ground 0V to convert a differential data input Vin to two complimentary outputs 311 and 312. The power of each output (311 or 312) is evenly split by a splitter (not explicitly shown) to two halves. The first output 311 is split to a first drive output 321 and a second drive output 324 respectively fed to a first N-electrode 341 of a first branch (top one in FIG. 6) of the MZM and to a second P-electrode 344 of a second branch (bottom one in FIG. 6) of the MZM. At the same time, the second output 312 is split to a third drive output 322 and a fourth drive output 323 respectively fed to a first P-electrode 342 of the first branch and to a second N-electrode 343 of the second branch. Effectively, the first drive output 321 and the third drive output 322 forms a first differential drive voltage to drive two electrodes of the first branch and the second drive output 324 and the fourth drive output 323 forms a second differential drive voltage to drive two electrodes of the second branch. Optionally, a pre-driver 301 is disposed between the differential data input Vin and the driver 310.

In the embodiment, the first and the second branches of the MZM are configured to be substantially the same as those in the embodiment of FIG. 5 by coupling a plurality segmented MZ-capacitors associated the transmission line (31 or 32) respectively to two electrodes (N and P) via two sets of coupling capacitors Cc and connecting two common bias nodes VbiasN and VbiasP via two sets of leakage resistors $R_h$. Each lumped RC element is a reflection cancellation sub-circuit including a pair of leakage resistors $R_h$ and a MZ-capacitor Cmz. All electrodes of the two branches are terminated to a same supply voltage Vcc via a termination resistor RT. Proper bias conditions are provided to the two bias nodes VbiasP and VbiasN to ensure non-forward bias status for the PN-junction of each branch. The two complimentary outputs 321 and 322 applied to the first branch can be illustrated by two waveforms substantially similar to those shown in FIG. 4, each with a peak-to-peak swing Vppd/2 around a same DC level of Vcc-Vppd/4. Similarly, the two complimentary outputs 323 and 324 provided to the second branch can be also illustrated by two waveforms substantially similar to those shown in FIG. 4 but with 180 degrees out of phase, each with a peak-to-peak swing Vppd/2 around a same DC level of Vcc−Vppd/4. Overall, the light waves that pass through two transmission lines 21 and 22 respectively associated with the first and second branch can be recombined and outputted as a modulated light driven by a peak-to-peak differential swing of 2×Vppd. Therefore, the driver configuration with single driver disclosed in FIG. 6 doubles the swing on modulating light signal through the MZM with a same length.

In an alternative embodiment, for each of the driver configurations shown in FIG. 3, FIG. 5, and FIG. 6, a variable-gain amplifier (VGA) can be disposed between a pre-driver and two (or one) differential drivers. The pre-driver serves a same function of the pre-driver 201 or 202 for processing the differential data input. Using the configuration with two drivers (FIG. 3) as an example, the VGA can be operated under two supplied voltages, Vcc1 and Vcc2, and is AC coupled to the first driver 110 and AC coupled to the second driver 120. The VGA acts as the same as a differential amplifier to amplify the differential data input with a factor of a VGA-depended gain control voltage and output a pair of complimentary signals. The pair of complimentary signals then is split as a first differential input to the first driver 110 operated under the first voltage Vcc1 and the second voltage Vcc2 and a second differential input respectively to the second driver 120 operated under the third voltage Vcc3 and the fourth voltage Vcc4. If the received signal Vin has a peak-to-peak differential of 500 mVpp and the VGA-depended gain control voltage to generate 1 Vpp peak-to-peak differential, then the first driver 110 will see 1 Vpp at its input and the same for the second driver 120. The first differential input and the second differential input is configured to have a same peak-to-peak differential value but different DC voltage levels. For example, the first differential input has a first DC voltage level set between the first voltage Vcc1 and the second voltage Vcc2. The second differential input has a second DC voltage level set between the third voltage Vcc3 and the fourth voltage Vcc4.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An apparatus for driving a Mach-Zehnder modulator (MZM), the apparatus comprising:
    a first driver supplied by a first voltage and a second voltage and configured to provide a first pair of complimentary outputs respectively to drive a first N-electrode and a first P-electrode of a first branch of the MZM configured as a first plurality of lumped RC elements through a first optical transmission line respectively coupled to the first N-electrode via a first plurality of first coupling capacitors and to the first P-electrode via a first plurality of second coupling capacitors, the first transmission line being configured to pass a first light wave split from a continuous-wave laser input;
    a second driver supplied by the first voltage and the second voltage and configured to provide a second pair of complimentary outputs respectively to drive a second N-electrode and a second P-electrode of a second branch of the MZM configured as a second plurality of lumped RC elements through a second optical transmission line respectively coupled to the second N-electrode via a second plurality of first coupling capacitors and to the second P-electrode via a second plurality of second coupling capacitors, the second transmission line being configured to pass a second light wave split from the same continuous-wave light input;
    wherein the first pair of complimentary outputs and the second pair of complimentary outputs are configured to be out of phase to each other and have a same peak-to-peak differential swing for respectively modulating the first light wave through the first transmission line and the second light wave through the second transmission line and to produce a modulated light based on twice of the peak-to-peak differential swing across the MZM.

2. The apparatus of claim 1 wherein the modulated light is configured to be in either NRZ format or PAM format.

3. The apparatus of claim 1 wherein each lumped RC element in the first or second branch of the MZM comprises a reflection-cancellation sub-circuit including a pair of leakage resistors respectively coupled to two terminals of a MZ-capacitor, the pair of leakage resistors respectively coupled to a first bias node with a first bias voltage relative to the first or second P-electrode and a second bias node with a second bias voltage relative to the first or second N-electrode to ensure a non-forward biasing condition for the MZM.

4. The apparatus of claim 3 wherein the MZ-capacitor is a parasitic capacitor of a segmented waveguide broken from a total length of a linear silicon waveguide including a P-type region in parallel sided with an N-type region along a lengthwise direction on a SOI substrate.

5. The apparatus of claim 3 wherein each of the first coupling capacitors, the second coupling capacitors, and the leakage resistors is integrated together with a MZ-capacitor in a corresponding lumped RC element within the MZM.

6. The apparatus of claim 3 wherein each of the first coupling capacitors, the second coupling capacitors, and the leakage resistors is integrated as part of the first driver and the second driver and coupled to a MZ-capacitor in a corresponding lumped RC element within the MZM.

7. The apparatus of claim 3 wherein each of the first P-electrode, the first N-electrode, the second P-electrode, and the second N-electrode is terminated at the first voltage through a termination resistor given that the first voltage is supplied as a positive voltage and the second voltage is 0V.

8. A driver structure for driving a Mach-Zehnder modulator (MZM), the apparatus comprising:
    a driver supplied by a first voltage and a second voltage and configured to provide a first output and a second output complimentary to the first output, the first output being split evenly to respectively drive a first N-electrode of a first branch of the MZM and a second P-electrode of a second branch of the MZM, the second output being split evenly to respectively drive a first P-electrode of the first branch of the MZM and a second N-electrode of the second branch of the MZM;
    wherein the first branch is configured as a first plurality of lumped RC elements laid in parallel through a first optical transmission line respectively coupled to the first N-electrode via a first plurality of first coupling capacitors and to the first P-electrode via a first plurality of second coupling capacitors, the first transmission line being configured to pass a first light wave being one-half split from a continuous-wave laser input;
    wherein the second branch is configured as a second plurality of lumped RC elements laid in parallel through a second optical transmission line respectively coupled to the second N-electrode via a second plurality of first coupling capacitors and to the second P-electrode via a second plurality of second coupling capacitors, the second transmission line being configured to pass a second light wave being remaining one-half split from the same continuous-wave light input;

wherein the first output and the complimentary second output are configured to have a same peak-to-peak differential swing for respectively modulating the first light wave through the first transmission line and the second light wave through the second transmission line and to produce a modulated light based on twice of the peak-to-peak differential swing across the MZM.

9. The driver structure of claim 8 wherein the modulated light is configured to be in either NRZ format or PAM format.

10. The driver structure of claim 8 wherein each lumped RC element in the first or second branch of the MZM comprises a reflection-cancellation sub-circuit including a pair of leakage resistors respectively coupled to two terminals of a MZ-capacitor, the pair of leakage resistors respectively coupled to a first bias node with a first bias voltage relative to the first or second P-electrode and a second bias node with a second bias voltage relative to the first or second N-electrode to ensure a non-forward biasing condition for the MZM.

11. The driver structure of claim 10 wherein the MZ-capacitor is a parasitic capacitor of a segmented waveguide broken from a total length of a linear silicon waveguide including a P-type region in parallel sided with an N-type region along a lengthwise direction on a SOI substrate.

12. The driver structure of claim 10 wherein each of the first coupling capacitors, the second coupling capacitors, and the leakage resistors is integrated together with a MZ-capacitor in a corresponding lumped RC element within the MZM.

13. The driver structure of claim 10 wherein each of the first coupling capacitors, the second coupling capacitors, and the leakage resistors is integrated as part of the driver and coupled to a MZ-capacitor in a corresponding lumped RC element within the MZM.

14. The driver structure of claim 10 wherein each of the first P-electrode, the first N-electrode, the second P-electrode, and the second N-electrode is terminated at the first voltage through a termination resistor given that the first voltage is supplied as a positive voltage and the second voltage is 0V.

* * * * *